United States Patent
Lee et al.

(10) Patent No.: US 10,180,587 B2
(45) Date of Patent: Jan. 15, 2019

(54) LIGHT MODULATORS AND DIGITAL EXPOSURE APPARATUSES INCLUDING THE SAME

(71) Applicant: Samsung Electronics Co., Ltd., Suwon-Si, Gyeonggi-Do (KR)

(72) Inventors: Duhyun Lee, Yongin-si (KR); Byungkyu Lee, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 539 days.

(21) Appl. No.: 14/528,394

(22) Filed: Oct. 30, 2014

(65) Prior Publication Data
US 2015/0323816 A1 Nov. 12, 2015

(30) Foreign Application Priority Data
May 7, 2014 (KR) .................. 10-2014-0054428

(51) Int. Cl.
*H01L 29/06* (2006.01)
*G02F 1/017* (2006.01)
*G03F 7/20* (2006.01)

(52) U.S. Cl.
CPC .......... *G02F 1/017* (2013.01); *G03F 7/70058* (2013.01); *G03F 7/70291* (2013.01)

(58) Field of Classification Search
CPC ...................................................... G02F 1/017
USPC ......................................................... 257/14
See application file for complete search history.

(56) References Cited

U.S. PATENT DOCUMENTS

| | | | |
|---|---|---|---|
| 5,488,504 A * | 1/1996 | Worchesky | B82Y 20/00 359/248 |
| 5,530,580 A | 6/1996 | Thompson et al. | |
| 5,825,525 A | 10/1998 | Harwit | |
| 6,473,237 B2 | 10/2002 | Mei | |
| 6,965,387 B2 | 11/2005 | Mei et al. | |
| 7,102,807 B2 | 9/2006 | Shi et al. | |
| 7,110,082 B2 | 9/2006 | Smirnov et al. | |
| 7,120,183 B2 | 10/2006 | Krasulick et al. | |
| 7,154,587 B2 | 12/2006 | Bleeker | |
| 7,196,349 B2 | 3/2007 | Alavi et al. | |
| 7,605,390 B2 | 10/2009 | Chen et al. | |
| 7,666,696 B2 | 2/2010 | Hersee | |
| 7,667,819 B2 | 2/2010 | Menon et al. | |
| 7,800,811 B2 | 9/2010 | Lous | |
| 2002/0190263 A1 * | 12/2002 | Hata | H01L 33/007 257/103 |
| 2003/0214571 A1 * | 11/2003 | Ishikawa | B23K 26/0604 347/255 |

(Continued)

FOREIGN PATENT DOCUMENTS

| | | |
|---|---|---|
| CN | 102798988 A | 11/2012 |
| KR | 20050031476 A | 4/2005 |
| KR | 20110086364 A | 7/2011 |

*Primary Examiner* — Ajay K Arora
(74) *Attorney, Agent, or Firm* — Harness, Dickey & Pierce, P.L.C.

(57) ABSTRACT

A light modulator may include: a light modulating unit formed as a pixel-array type by using a PIN diode including multiple quantum wells including a Group-III nitride semiconductor material, and configured to modulate light by electroabsorption; and/or a control unit including a transistor configured to control voltage applied to the PIN diode of the light modulating unit. The PIN diode and the transistor may be arrayed in an active matrix form.

21 Claims, 9 Drawing Sheets

(56) References Cited

U.S. PATENT DOCUMENTS

| | | | |
|---|---|---|---|
| 2007/0036189 A1* | 2/2007 | Hori | H01S 5/183 |
| | | | 372/50.11 |
| 2007/0103612 A1 | 5/2007 | Lumpkin | |
| 2007/0165188 A1* | 7/2007 | Cho | B82Y 20/00 |
| | | | 353/31 |
| 2008/0101425 A1 | 5/2008 | Murata et al. | |
| 2008/0284929 A1* | 11/2008 | Kimura | G02F 1/13624 |
| | | | 349/38 |
| 2010/0157408 A1* | 6/2010 | Chung | G02F 1/17 |
| | | | 359/263 |

* cited by examiner

APPLIED VOLTAGE = 0
UV TRANSMISSION

APPLIED VOLTAGE < 0
UV ABSORPTION

LIGHT MODULATORS AND DIGITAL EXPOSURE APPARATUSES INCLUDING THE SAME

CROSS-REFERENCE TO RELATED APPLICATION(S)

This application claims priority from Korean Patent Application No. 10-2014-0054428, filed on May 7, 2014, in the Korean Intellectual Property Office (KIPO), the entire contents of which are incorporated herein by reference.

BACKGROUND

1. Field

Some example embodiments may relate generally to light modulators and/or digital exposure apparatuses including the same. Some example embodiments may relate generally to electroabsorption-type light modulators and/or digital exposure apparatuses including the same.

2. Description of Related Art

Generally, a method of forming a pattern on a substrate in a process of forming various flat panels for display such as a liquid crystal display (LCD) or an organic light emitting display (OLED), may be as follows: first, a pattern material is applied on a substrate, and selective exposure is performed on the pattern material by using a photomask, and then, pattern material parts having altered chemical properties or the other parts are removed selectively to thus form a pattern.

A digital exposure apparatus capable of forming a pattern on a substrate without using a photomask may have been developed according to gradual substrate enlargement and pattern refinement.

Such a digital exposure apparatus may have been suggested to solve the cost problem of lithography using existing expensive photomasks. The digital exposure apparatus may employ techniques of forming intended patterns by using light modulators, wherein pixels capable of changing their transmission or reflection of light are arranged and controlled in the light modulators, unlike using a photomask, which blocks light to certain pixels by using, for example, chromium (Cr) on a quartz substrate.

That is, the digital exposure apparatus may form patterns by using methods of irradiating light beams onto substrates, with pattern information formed of electrical signals, by using light modulators. The light modulators may be digital micro-mirror devices (DMDs), for example. The DMDs may include a plurality of micro mirrors that send light incident with a certain angles at a desired angle, and send the other light at different angles, to thus form a pattern on an exposed surface by using only necessary light.

Light modulators using DMDs may have very slow response speeds of several hundred hertz (Hz) to several hundred kilohertz (kHz) and, so, it may be difficult to secure a take time required for mass production. Also, pixel sizes of such light modulators may only be in the tens of μm and, thus, have limitations in terms of realizing high resolutions.

SUMMARY

Some example embodiments may provide electroabsorption type light modulators enabling high speed response, obtaining a sufficient speed for mass production, and/or capable of reducing pixel sizes of an array to improve resolution. Some example embodiments may provide digital exposure apparatuses including the same.

In some example embodiments, a light modulator may comprise: a light modulating unit formed as a pixel-array type by using a PIN diode including multiple quantum wells comprising a Group-III nitride semiconductor material, and configured to modulate light by electroabsorption; and/or a control unit including a transistor configured to control voltage applied to the PIN diode of the light modulating unit. The PIN diode and the transistor may be arrayed in an active matrix form.

In some example embodiments, the light modulating unit may comprise: a mirror layer on at least one of an upper part of the PIN diode and a lower part of the PIN diode.

In some example embodiments, the mirror layer may be a distributed Bragg reflector (DBR).

In some example embodiments, the light modulating unit may comprise: a first mirror layer and a second mirror layer as a stack structure on an upper part of the PIN diode and a lower part of the PIN diode, respectively. At least one of the first mirror layer and the second mirror layer is a distributed Bragg reflector (DBR).

In some example embodiments, the light modulating unit may comprise: a mirror layer on one of an upper part of the PIN diode and a lower part of the PIN diode; and/or a distributed Bragg reflector (DBR) on the other one of the upper and lower parts of the PIN diode.

In some example embodiments, the light modulating unit and the control unit may form a stack structure.

In some example embodiments, the light modulating unit may comprise a first distributed Bragg reflector (DBR), a first material layer doped with a first conductivity type, a multiple quantum well layer, a second material layer doped with a second conductivity type opposite to the first conductivity type, and a mirror layer, stacked on a first substrate sequentially. The first material layer, the multiple quantum well layer, and the second material layer may comprise Group-III nitride semiconductor material and form the PIN diode.

In some example embodiments, the first material layer may comprise GaN.

In some example embodiments, the second material layer may comprise GaN.

In some example embodiments, the first and second material layers may comprise GaN.

In some example embodiments, the multiple quantum well layer may comprise a multiple quantum well structure of InGaN/GaN.

In some example embodiments, the first DBR may comprise a repeating stack of AlGaN/GaN.

In some example embodiments, the mirror layer may be a second DBR. An electrode layer may be on the mirror layer.

In some example embodiments, the mirror layer may be configured as an electrode layer.

In some example embodiments, a buffer layer may be between the first substrate and the first DBR.

In some example embodiments, the buffer layer may comprise undoped GaN.

In some example embodiments, the first substrate may comprise material including sapphire.

In some example embodiments, the control unit may comprise: a second substrate; and/or a transistor array on the second substrate.

In some example embodiments, the second substrate may comprise material including silicon.

In some example embodiments, a manufacturing method of a light modulator may comprise: forming a light modulating unit in a form of a pixel array; forming a control unit;

and/or bonding the light modulating unit to the control unit, so that a transistor, which controls a voltage applied to the PIN diode of the light modulating unit, is at a position corresponding to the light modulating unit of each pixel of the pixel array.

In some example embodiments, the light modulating unit may be bonded to the control unit by flip-chip bonding.

In some example embodiments, a digital exposure apparatus may comprise:

a light source unit configured to generate light; and/or a light modulator comprising: a light modulating unit formed as a pixel-array type by using a PIN diode including multiple quantum wells comprising a Group-III nitride semiconductor material, and configured to modulate light by electroabsorption; and/or a control unit including a transistor configured to control voltage applied to the PIN diode of the light modulating unit. The light modulator may be configured to modulate an incident light beam emitted from the light source unit to an exposure beam that has image information to be exposed. The PIN diode and the transistor may be arrayed in an active matrix form.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
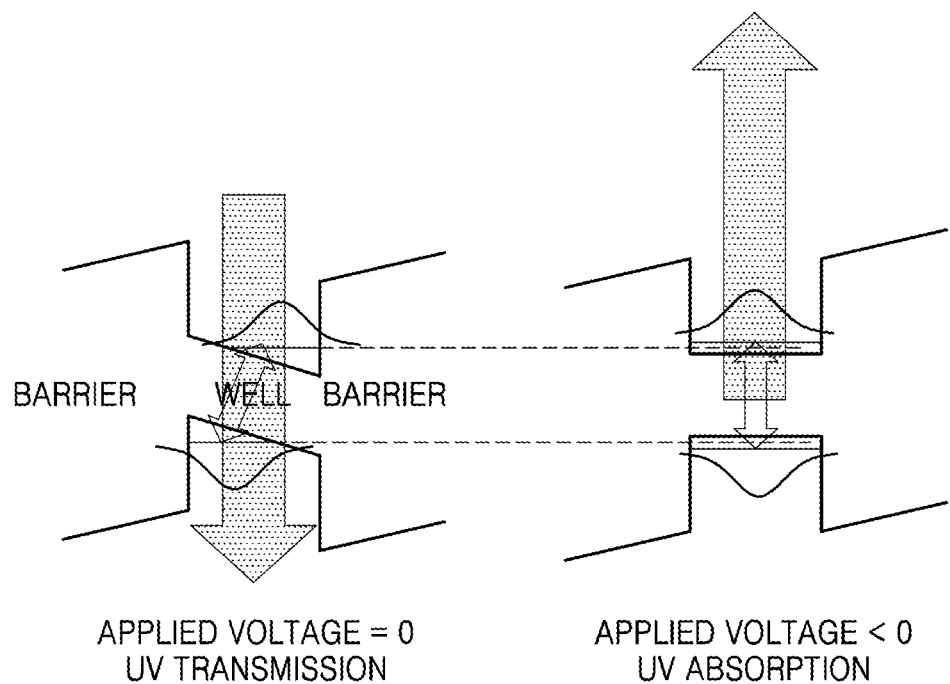
FIG. 1 is a view of an operating principle of multiple quantum wells (MQW)

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
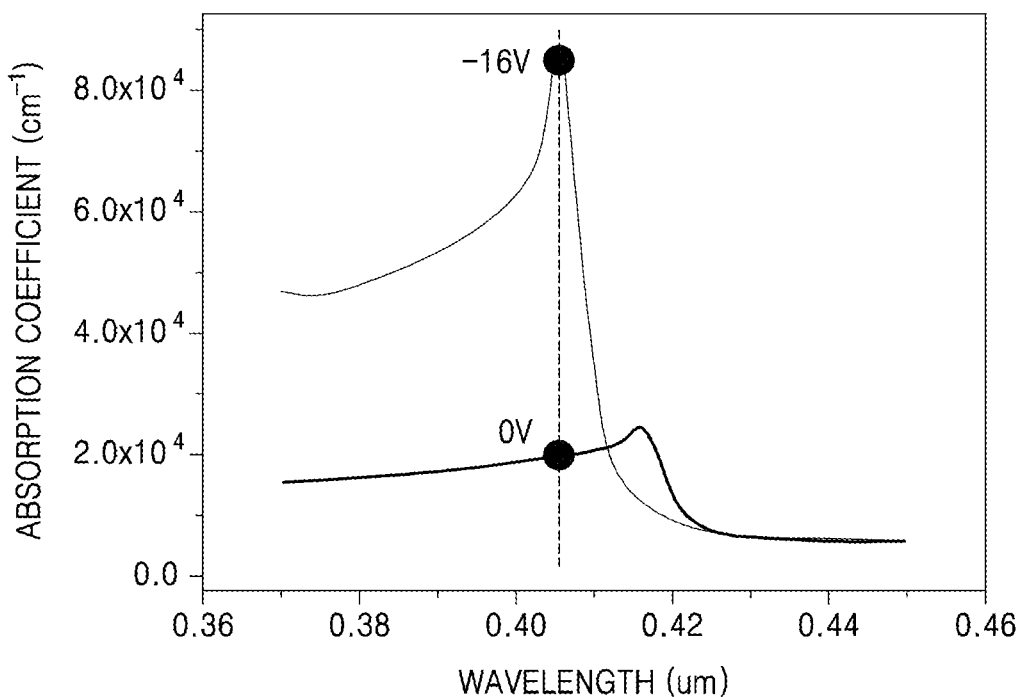
FIG. 2 is a graph showing optical absorption coefficient changes of an InGaN well layer according to an application of voltage to an InGaN/GaN MQW.

Semiconductor materials may absorb light irradiated thereon as long as the light has energy corresponding to a bandgap energy of the materials. The amount of light absorbed varies according to an applied voltage and is changed when a reverse voltage is applied to both ends of semiconductor materials, as illustrated in FIG. 1. The phenomenon occurs when a bandgap structure is changed by an applied voltage and an electron-hole pair is formed by optical absorption. The phenomenon may appear in a bulk structure semiconductor, and particularly in multiple quantum wells (MQWs) due to a quantum confinement effect, as illustrated in a graph of FIG. 2. The graph illustrated in FIG. 2 shows a result of calculating an optical absorption coefficient of an indium gallium nitride (InGaN) well layer in an InGaN/GaN MQW of a light modulator according to some example embodiments, wherein the InGaN/GaN MQW of a light modulator is designed to modulate 405 nanometer (nm) ultraviolet (UV) light. The graph shows that the optical absorption coefficient is low when a voltage is not applied to the MQWs, but is increased more than 4 times with a reverse voltage application of about 16 volts (V). This means that modulation of transmissivity or reflectivity is possible by controlling the amount of optical absorption of a relevant wavelength according to changes of the optical absorption coefficient. Wavelengths used in digital exposure, mainly use a g-line (436 nm), h-line (405 nm), and i-line (365 nm) (substantially 436 nm~365 nm wavelength) wavelength band in the UV range.

The light modulator according to some example embodiments modulates UV light per each pixel by electroabsorption. The UV light is within a UV range mainly used in digital exposure, such as a g-line, h-line, and i-line (substantially 436 nm~365 nm wavelength) wavelength band, or is UV light of substantially 230 nm~280 nm wavelength obtained by a krypton fluoride (KrF) laser.

The light modulator according to some example embodiments uses Group III nitrides such as gallium nitride (GaN), indium nitride (InN), and aluminum nitride (AlN) which are semiconductor materials having a bandgap in a UV range wavelength band, wherein the light modulator may form a quantum well structure so that a well region may have an intended wavelength bandgap, and a barrier region may have a much wider bandgap than that of the well region, through the Group III nitrides or an alloy thereof and, thus, the light modulator may be used as an electroabsorption-type light modulator in an intended wavelength band.

The wavelength band applied to the light modulator according to some example embodiments is not limited to the example embodiments above. Various wavelength bands capable of electroabsorption may be obtained through semiconductor materials including Group III nitrides.

When a reverse voltage is applied to a PIN diode formed of a p-GaN/InGaN/n-GaN structure, h-line UV light (substantially 405 nm wavelength) may be modulated. At this time, when the PIN diode is formed of a MQW structure, the same as the light modulator according to some example embodiments, the light modulator may exhibit increased light modulation efficiency and a voltage used in modulation may be reduced, compared to when the light modulator uses a PIN diode formed of a bulky diode structure. The PIN diode formed of an MQW structure may be realized by laminating an MQW structure formed of an InGaN well and a GaN barrier on an n-GaN layer, and further laminating a p-GaN layer on the MQW structure. In some example embodiments, the light modulator may modulate 405 nm h-line UV light.

The light modulator according to some example embodiments may be formed to transmit light of an intended wavelength through all layers, excluding a well or a mirror layer. For example, the light modulator may transmit g-line, h-line, and i-line (substantially 436 nm~365 nm wavelength) UV light when a sapphire suitable for a Group III nitride semiconductor is used in a substrate that forms the PIN diode.

In some example embodiments, if a transparent electrode material such as indium tin oxide (ITO) or a thin metal material with a thickness of several nm is used on an upper p-contact electrode, the light modulator may be realized as a light-transmission type. Transmitted light intensity is controlled according to a reverse voltage applied to an electrode in the light-transmission-type light modulator. Meanwhile, all layers excluding a well may be manufactured to be transparent to an intended wavelength, and then a mirror may be formed on an upper p-contact part to reflect light incident on the mirror. Alternatively, the mirror may be formed on a lower part of the light modulator or a lower part of a substrate, wherein light irradiated from an upper part may be used. The mirror may be a thin metal film or a distributed Bragg reflector (DBR) structure, and may be used appropriately corresponding to a position of the mirror. If the light modulator is realized as a light-reflective type, light passes through MQWs more than 2 times and, thus, conversion efficiency may be improved. If the light modulator is realized as a light-transmission type, an optical system simpler than that of the light-reflective type may be used in an exposure apparatus. Also, an anti-reflection coating may be pre-formed on a plane whereon light of the light modulator is incident to increase an incidence rate. For example, if light is incident through a substrate, a dielectric such as silicon dioxide ($SiO_2$) or silicon nitride ($Si_3N_4$) may be coated on a back side of the substrate. The dielectric has an optical thickness that corresponds to a quarter of the intended wavelength.

The light modulator according to some example embodiments may have a layer capable of reflecting light at both ends of elements, and may have a structure wherein optical resonance occurs in a Fabry-Perot cavity and, thus, light incident on the light modulator may interact enough at an MQW region. In some example embodiments, light does not pass through the light modulator just after being incident once, but passes through the light modulator after being reflected several times in the light modulator during a resonance process.

For example, as described below in FIG. 6A, a DBR structure may be formed at both ends of the MQWs. When the MQWs are for the h-line (405 nm) UV light, for example, an AlGaN/GaN structure may be used as a DBR. A lower DBR, below an n-type material layer of the PIN diode having the MQWs, may be laminated without doping. If the light modulator is formed to input the light through the lower part and output the light through the lower part after reflection, reflectivity may be controlled in order for the reflectivity of the lower DBR to become lower than that of an upper DBR. Also, a difference in the reflectivity between both DBRs may be controlled in order to generate resonance.

Meanwhile, as described below in relation to FIG. 7A, a DBR of the AlGaN/GaN type may be formed in the lower part of the MQWs, and a metal film for a p-contact of the upper p-contact part may be used as a mirror. The lower DBR, below the n-type material layer of the PIN diode having the MQWs, may be laminated without doping.

The light modulator according to some example embodiments is formed in a two-dimensional (2D) array in the unit of a pixel in order to be used in digital exposure. Also, a region excluding an active region may be configured in the form of a black matrix 35 in order to prevent optical interference between each pixel, so that light may not be incident on neighboring pixels. The light modulator according to some example embodiments may have a control transistor in each pixel, so that the light modulator may control the modulation of each pixel in the form of an active matrix. In order to realize the light modulator in the form of the active matrix with a reflection type, the PIN diode including MQWs may be patterned after being grown, for example, on a sapphire wafer in an epitaxy process so that a pixel array may be formed. A control unit to control each pixel, that is a control circuit, for example, may be manufactured on a silicon wafer through a complementary metal-oxide semiconductor (CMOS) process. The light modulator according to some example embodiments may be obtained by bonding, for example, by flip-chip bonding, of the PIN diode to the control circuit forming each pixel.

Figure 3:
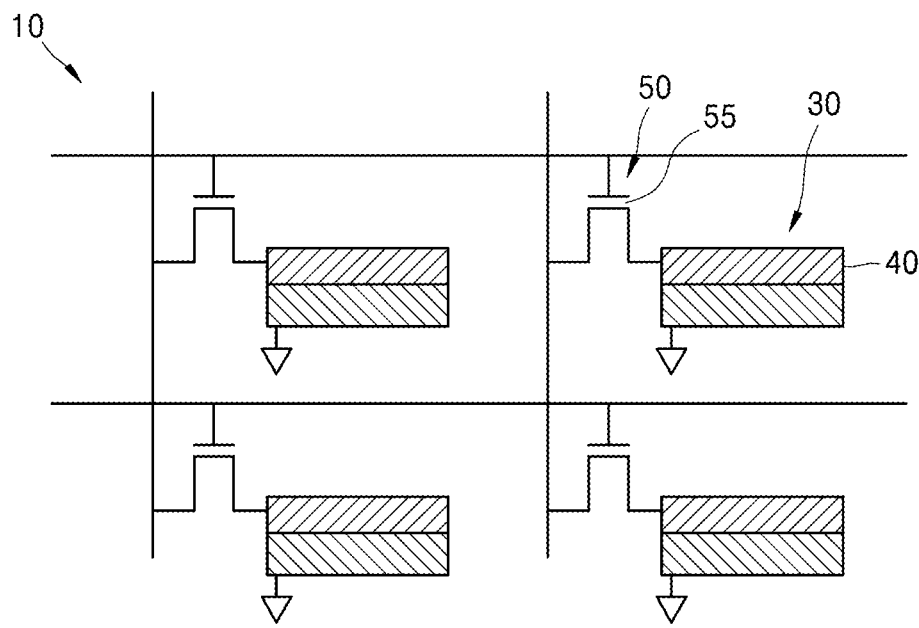
FIG. 3 is a schematic view of a pixel array of a light modulator according to some example embodiments.
Figure 4:
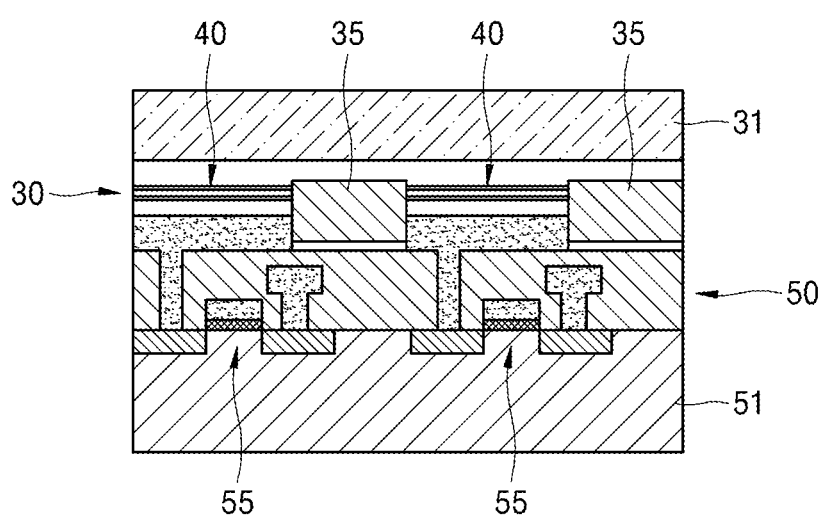
FIG. 4 is a schematic view of a stack structure of the light modulator illustrated in FIG. 3.
Figure 5:
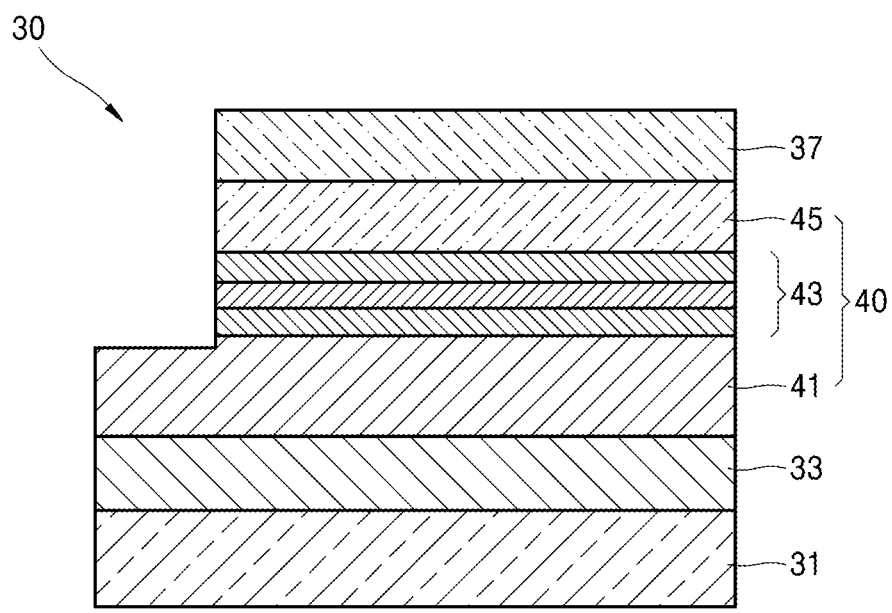
FIG. 5 is a view of an example embodiment of a light modulating unit of the light modulator illustrated in FIG. 3.

FIG. 3 shows a pixel array of a light modulator 10 according to some example embodiments. FIG. 4 shows a stack structure of the light modulator 10 illustrated in FIG. 3. FIG. 5 shows an example embodiment of a light modulating unit 30 of the light modulator 10 illustrated in FIG. 3.

Referring to FIGS. 3 through 5, the light modulator 10 according to some example embodiments includes the light modulating unit 30 formed as a pixel-array type by using a PIN diode 40, and a control unit 50 that includes a transistor 55 (e.g., a thin film transistor (TFT)) to control a voltage applied to the PIN diode 40 of the light modulating unit 30. The PIN diode 40 and the transistor 55 may be arrayed in an active matrix form as illustrated in FIG. 3.

Referring to FIG. 4, the light modulating unit 30 may be formed on a first substrate 31. The first substrate 31 may be a transparent substrate (e.g., a sapphire substrate). The control unit 50 may include a second substrate 51 and arrays of the transistors 55 formed on the second substrate 51. The second substrate 51 may be a substrate (e.g., a silicon substrate) usable in manufacturing semiconductor circuits. In some example embodiments, when the light modulator according to some example embodiments is a light-transmission type, various transparent substrates that are used for manufacturing transparent thin film transistors or transparent flat panel displays, may be applied as the second substrate 51. Furthermore, the control unit 50 may also be formed of a transparent circuit.

As described in FIG. 4, the light modulating unit 30 may be bonded to the control unit 50 so as to have a stack structure. The light modulating unit 30 and the control unit 50 may be bonded each other so that the transistor 55, which controls a voltage applied to the PIN diode 40 of the light modulating unit 30, may located at a position corresponding to the light modulating unit 30 of each pixel. The light modulating unit 30 may be bonded to the control unit 50, for example, by a flip-chip bonding method.

The light modulating unit 30, wherein a laminate structure including the PIN diode 40 having MQWs is grown epitaxially and patterned, may be formed of a pixel array. The light modulating unit 30 forms a region excluding the active region in the form of a black matrix in order to prevent an optical interference between each pixel, so that light may not be incident on neighboring pixels.

The control unit 50 for controlling the light modulating unit 30 formed of a pixel array may be manufactured on the second substrate 51, for example, through a CMOS process.

The light modulator 10 according to some example embodiments may be obtained by bonding (e.g., flip-chip bonding) of the light modulating unit 30, including the PIN diode 40 forming each pixel, to the control unit 50 (control circuit).

Referring to FIG. 5, the light modulating unit 30 may have the PIN diode 40 including the MQWs formed of a Group-III nitride semiconductor material. The light modulating unit 30 includes a first material layer 41 doped with a first conductivity type, a MQW layer 43, and a second material layer 45 doped with a second conductivity type opposite to the first conductivity type, wherein the first material layer 41, the MQW layer 43, and the second material layer 45 compose the PIN diode 40 formed of the Group-III nitride semiconductor material.

For example, the first and second material layers 41 and 45 may include GaN. The first material layer 41 may be doped with an n-type dopant, the second material layer 45 may be doped with a p-type dopant. For example, the first material layer 41 is formed of an n-GaN layer, and the second material layer 45 is formed of a p-GaN layer. The MQW layer 43 may be formed of an MQW structure of InGaN/GaN.

The first material layer 41, the MQW layer 43, and the second material layer 45 may have various component materials having a bandgap in a UV region wavelength band. The various component materials may be semiconductor materials including various Group III nitrides such as GaN, InN, and AlN.

Meanwhile, the light modulating unit 30 may further include a mirror layer formed on at least one of an upper part of the PIN diode and a lower part of the PIN diode. For example, the light modulating unit 30 may further include first and second mirror layers 33 and 37 on upper and lower parts of the PIN diode respectively as illustrated in FIG. 5. Thus, when the first and second mirror layers 33 and 37 are disposed on both ends of the PIN diode 40, the light modulating unit 30 may be formed as a Fabry-Perot resonator, wherein light may be resonated.

At this time, at least one of the first mirror layer 33 and the second mirror layer 37 may be formed of a DBR. For example, the light modulating unit 30 may have a structure including the first mirror layer (DBR) 33, the first material layer 41, the MQW layer 43, the second material layer 45, and the second mirror layer 37, which are stacked on the first substrate 31 sequentially. Also, the light modulating unit 30 may have a structure including the first mirror layer (DBR) 33, the first material layer 41, the MQW layer 43, the second material layer 45, and the second mirror layer (DBR) 37, which are stacked on the first substrate 31 sequentially. That is, the DBR is applied as the first mirror layer 33, and the DBR or a simple reflection film is applied as the second mirror layer 37.

Thus, when the DBR is applied as the first mirror layer 33 located on the lower part of the PIN diode 40, and the simple reflection film is applied as the second mirror layer 37 located on the upper part of the PIN diode 40, the second mirror layer 37 may be also used as a p-type contact electrode by being formed of electrode materials (e.g., gold (Au)).

As described above, if the first and second mirror layers 33 and 37 are disposed on the lower and upper parts of the PIN diode 40 to form the Fabry-Perot resonator, light, incident on the light modulating unit 30 through the first substrate 31, does not emit from the light modulating unit 30 just after being incident once but emits from the light modulating unit 30 after being reflected several times in the light modulating unit 30 during a resonance process, so that an electroabsorption rate may be increased.

Due to a reflectivity difference of the first and second mirror layers 33 and 37, the light modulator 10 according to some example embodiments may be operated as a reflection type or as a transmission type. For example, considering incident light through the first substrate 31, when the reflectivity of the second mirror layer 37 is greater than that of the first mirror layer 33, the light modulator 10 may be operated as the reflection type since light is modulated by the light modulator 10 and emitted through the first substrate 31. Meanwhile, when the reflectivity of the second mirror layer 37 is less than that of the first mirror layer 33, the light modulator 10 may be operated as the transmission type since light is modulated by the light modulator 10 and emitted through the opposite side of the first substrate 31.

Figure 6A:
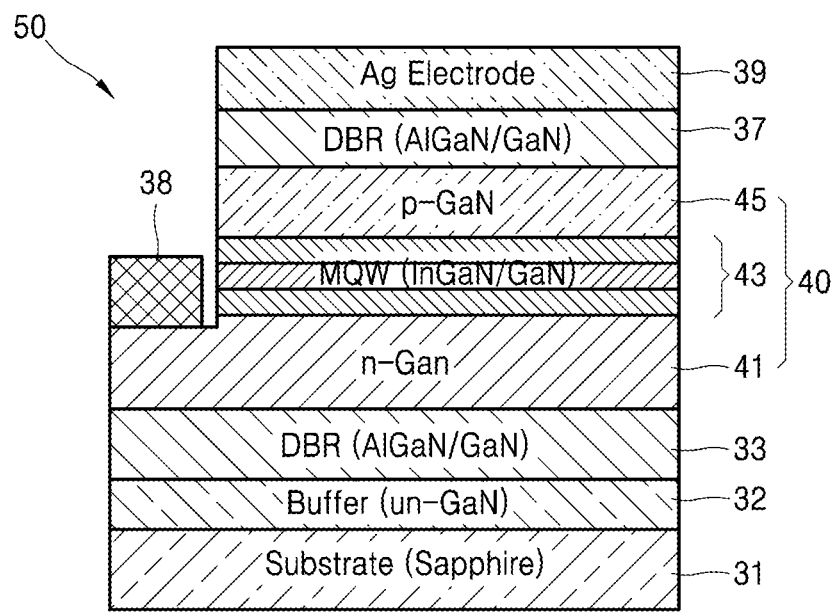
FIG. 6A is a view of a laminate structure of the light modulating unit of the light modulator according to some example embodiments.
Figure 6B:
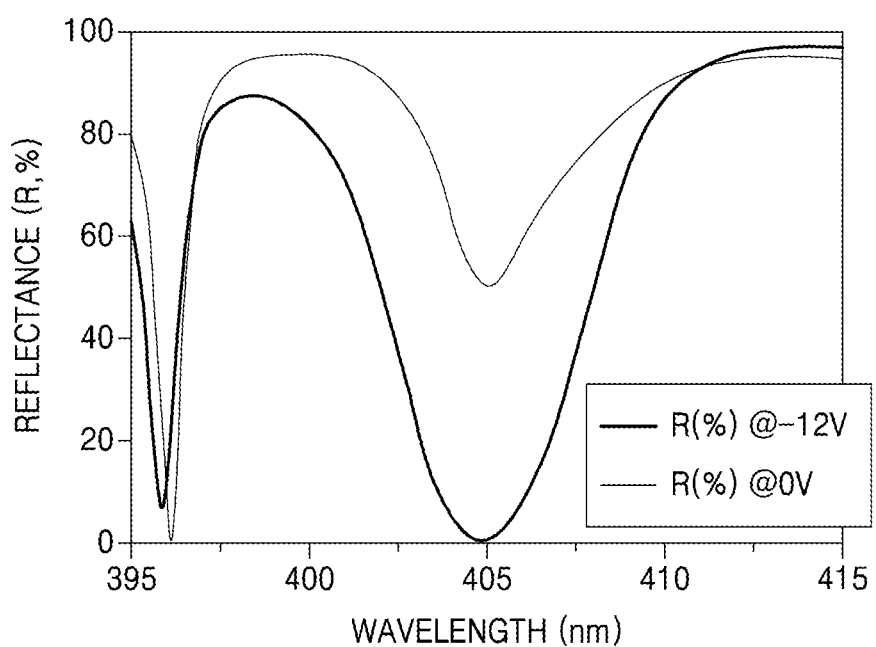
FIG. 6B is a graph showing ultraviolet (UV) reflectivity changes according to a voltage applied to the light modulating unit illustrated in FIG. 6A.

FIG. 6A shows an example of a laminate structure of the light modulating unit 30 of the light modulator 10 according to some example embodiments. FIG. 6B is a graph showing UV reflectivity changes according to a voltage applied to the light modulating unit 30 illustrated in FIG. 6A.

Referring to FIG. 6A, the light modulating unit 30 may be the laminate structure including the first mirror layer 33, the PIN diode 40, and the second mirror layer 37 on the first substrate 31. The PIN diode 40 may include the first material layer 41, the MQW layer 43, and the second material layer 45. The light modulating unit 30 may further include a buffer layer 32 between the first substrate 31 and the first mirror layer 33. Also in FIG. 5, the light modulating unit 30 may further include the buffer layer 32 between the first substrate 31 and the first mirror layer 33.

The first substrate 31 may be a sapphire substrate. The buffer layer 32 may be an undoped GaN layer (un-GaN). The first mirror layer 33 may be a DBR, and for example, may be formed of an AlGaN/GaN repetition stack structure. In the PIN diode 40, the first material layer 41 may be a GaN layer (n-GaN) doped with an n-type dopant, the MQW layer 43 may be formed of an MQW structure of InGaN/GaN, and the second material layer 45 may be a GaN layer (p-GaN) doped with a p-type dopant. The second mirror layer 37 may be a DBR, and may be formed of an AlGaN/GaN repetition stack structure. When the second mirror layer comprises the DBR, a first electrode 39 (e.g., a p-type electrode) may be further disposed on the second mirror layer 37. The first electrode 39 may be formed of a metal material used for forming the electrode or an alloy thereof (e.g., silver (Ag) or Au). A second electrode 38 (e.g., an n-type electrode) may be disposed on a side of the first material layer 41.

When the light modulating unit 30 is formed as illustrated in FIG. 6A, the reflectivity may change as illustrated in FIG. 6B according to a voltage applied to the light modulating unit 30.

As seen in the graph of FIG. 6B, when the first and second mirror layers 33 and 37 are in a DBR+DBR form, a reflective light modulator may achieve about 50% conversion efficiency when about 12 V of reverse voltage is applied. In some example embodiments, it should be understood that the result of FIG. 6B is only one example, and does not restrict the conversion efficiency in the case of forming the first and second mirror layers 33 and 37 in the DBR+DBR form.

Figure 7A:
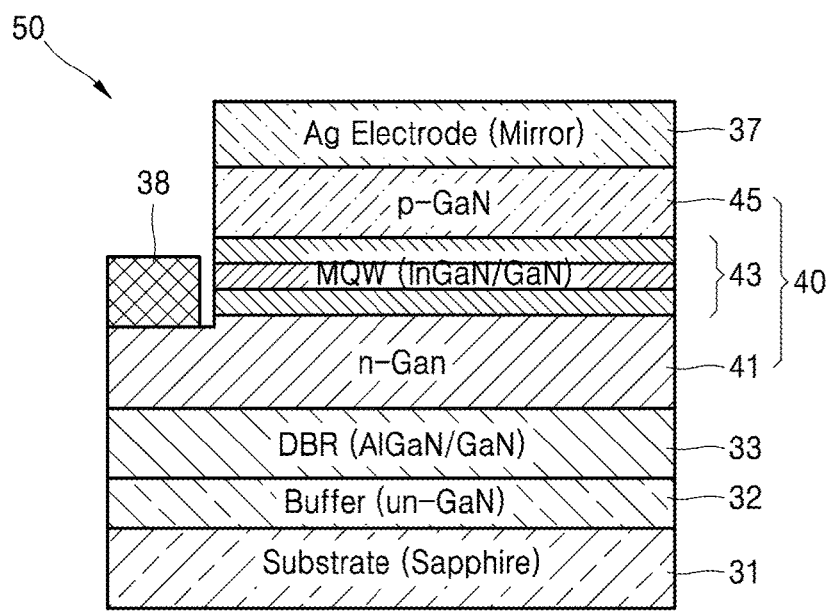
FIG. 7A is a view of a laminate structure of the light modulating unit of the light modulator according to some example embodiments.
Figure 7B:
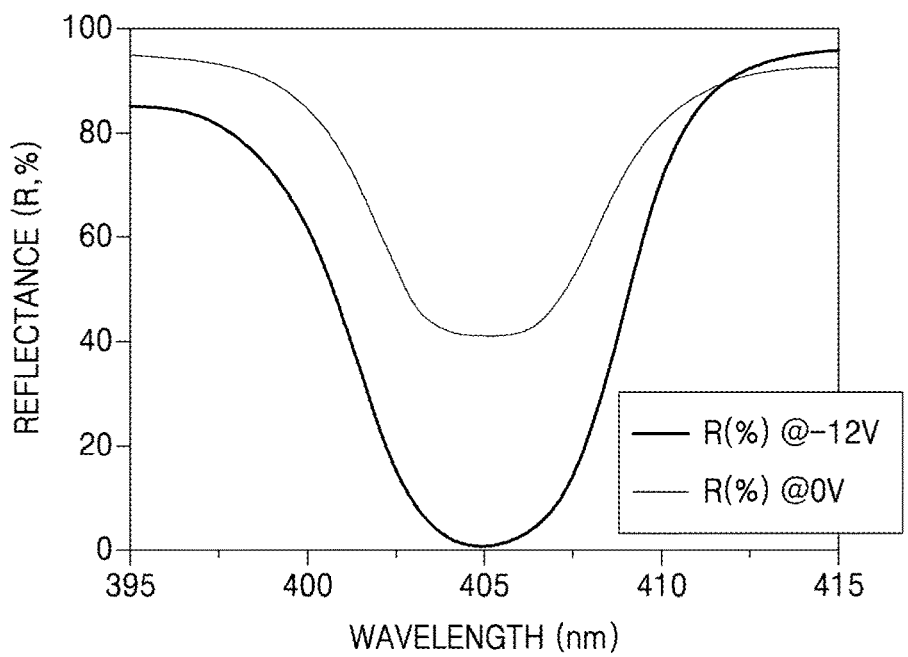
FIG. 7B is a graph showing UV reflectivity changes according to a voltage applied to the light modulating unit illustrated in FIG. 7A.

FIG. 7A shows another laminate structure of the light modulating unit 30 of the light modulator 10 according to some example embodiments, FIG. 7B is a graph showing UV reflectivity changes according to a voltage applied to the light modulating unit 30 illustrated in FIG. 7A.

Referring to FIG. 7A, the light modulating unit 30 may be the stack structure of the first mirror layer 33, the PIN diode 40, and the second mirror layer 37 on the first substrate 31. The PIN diode 40 may include the first material layer 41, the MQW layer 43, and the second material layer 45. The light modulating unit 30 may further include the buffer layer 32 between the first substrate 31 and the first mirror layer 33.

The first substrate 31 may be a sapphire substrate. The buffer layer 32 may be an undoped GaN layer (un-GaN). The first mirror layer 33 may be a DBR and, for example, may be formed of an AlGaN/GaN repetition stack structure. In the PIN diode 40, the first material layer 41 may be the GaN layer (n-GaN) doped with an n-type dopant, the MQW layer 43 may be formed of an MQW structure of InGaN/GaN, and the second material layer 45 may be the GaN layer (p-GaN) doped with a p-type dopant. The second mirror layer 37 is a simple reflection film, and may be used as the first electrode 39 in FIG. 6A (e.g., a p-type electrode). The second mirror layer 37 may be formed of metal materials used for forming an electrode or an alloy thereof (e.g., Au). The second electrode 38 (e.g., an n-type electrode) may be disposed on a side of the first material layer 41.

If the light modulating unit 30 is formed as illustrated in FIG. 7A, the reflectivity may change as illustrated in FIG. 7B according to a voltage applied to the light modulating unit 30.

As seen in the graph of FIG. 7B, when the first and second mirror layers 33 and 37 are in a DBR+Ag Mirror form, a reflective light modulator may achieve about 40% conversion efficiency when about 12 V of reverse voltage is applied. The conversion efficiency (about 40%) is lower than that (about 50%) of the first and second mirror layers 33 and 37 in the DBR+DBR form, but the light modulating unit 30 may have a simple stack structure and a wider bandwidth comparatively. However, it should be understood that the result of FIG. 7B is only one example, and does not restrict the conversion efficiency in the case of forming the first and second mirror layers 33 and 37 in the DBR+Ag Mirror form.

As seen from the graph of FIGS. 6A, 6B, 7A, and 7B, when the PIN diode 40 of the MQW structure is realized by stacking the MQW structure formed of the InGaN well and the GaN barrier on n-GaN, and further stacking p-GaN on the MQW structure, the light modulator 10 may modulate 405 nm h-line UV light, for example.

The light modulator 10 according to some example embodiments may be formed to have component materials which are suitable for modulating 405 nm h-line UV light, for example, according to the above description. However, it should be understood that the above description is only one example, and does not restrict the example embodiments. Component materials of the light modulator 10 according to some example embodiments may vary according to an intended wavelength ranges.

Figure 8:
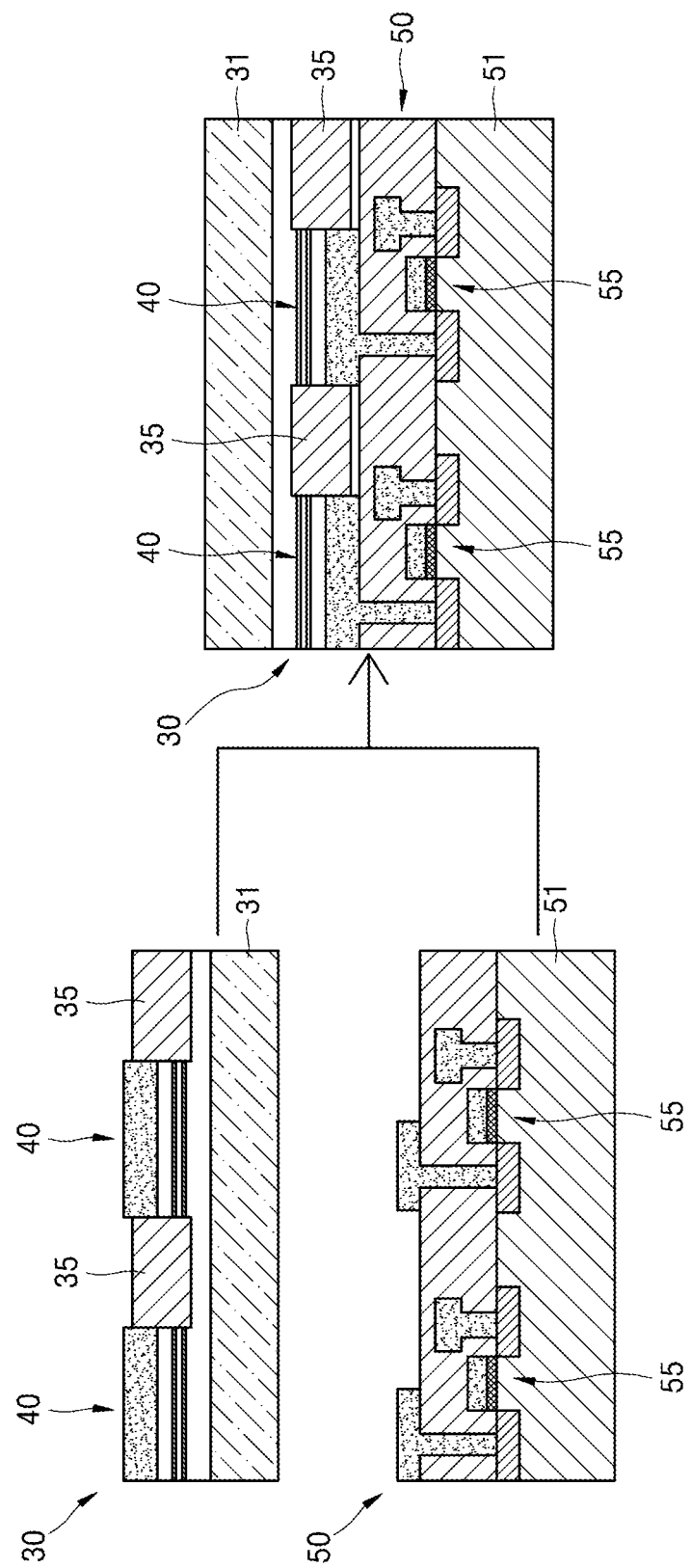
FIG. 8 is a schematic view of a manufacturing process of the light modulator according to some example embodiments.

FIG. 8 shows a manufacturing process of the light modulator 10 according to some example embodiments.

Referring to FIG. 8, in a method of manufacturing the light modulator 10 according to some example embodiments. First, the light modulating unit 30 that is a pixel-array type may be formed on the first substrate 31, and the control unit 50 including the transistors 55 to realize the active matrix may be formed on the second substrate 51. Next, the light modulating unit 30 and the control unit 50 may be bonded each other so that the transistors 55, which controls a voltage applied to the PIN diode 40 of the light modulating unit 30, may located at a position corresponding to the light modulating unit 30 of each pixel. Thus, the light modulator 10 according to some example embodiments may be obtained. The light modulating unit 30 may be bonded to the control unit 50, for example, by a flip-chip bonding method.

Figure 9:
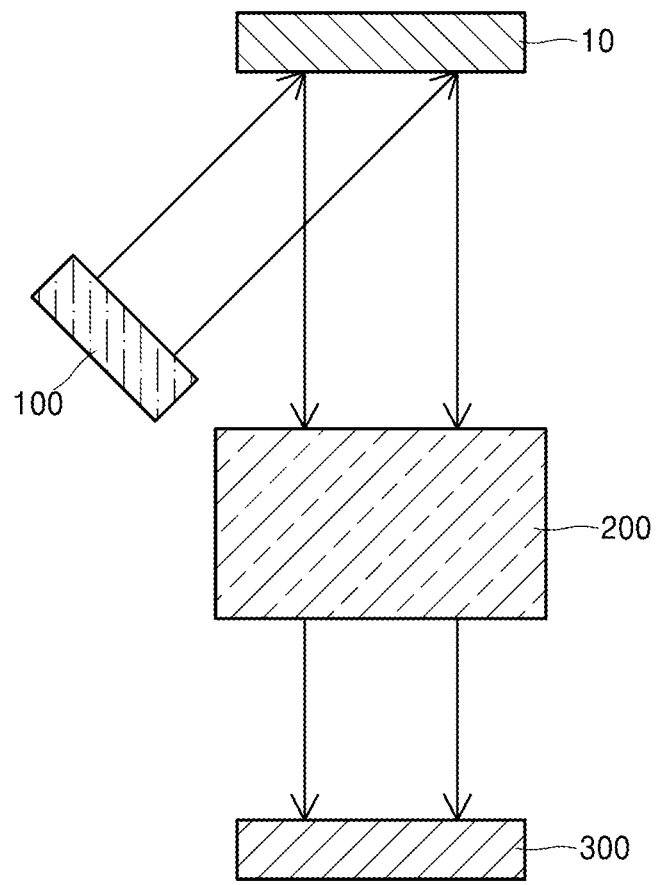
FIGS. 9 and 10 are schematic views of a digital exposure apparatus of the light modulator according to some example embodiments.
Figure 10:
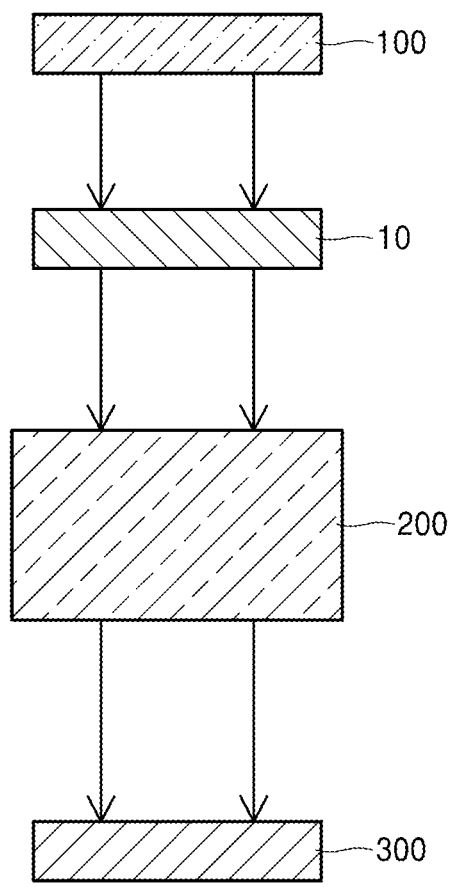

FIGS. 9 and 10 schematically show a digital exposure apparatus of the light modulator 10 according to some example embodiments. FIG. 9 shows an optical arrangement when the light modulator 10 according to some example embodiments is the reflection type, and FIG. 10 shows an optical arrangement when the light modulator 10 according to some example embodiments is the transmission type.

The digital exposure apparatus includes a light source unit 100 for generating light, and the light modulator 10. Collimated UV light emitted from the light source unit 100 is modulated by the light modulator 10 and irradiated to a substrate 300 whereon a photoresist is applied. The light modulator 10 controls the electroabsorption rate of UV light by controlling a voltage applied to each pixel, so that the light modulator 10 modulates the light beam emitted from the light source unit 100 to an exposure beam which has image information to be exposed. An optical system 200 such as a projection lens, a filter, and a micro lens array may further be used in the digital exposure apparatus. The optical system 200 irradiates the exposure beam from the light modulator 10 onto the photoresist applied on the substrate 300 in a proper state.

The digital exposure apparatus using the light modulator 10 according to some example embodiments may be used in manufacturing a display panel. In some example embodiments, the light modulator 10 may be manufactured to have a sufficient number of pixels capable of corresponding to a panel size, so that all or part of an area of the panel may be exposed altogether at the same time. If it is difficult to manufacture the light modulator 10 having enough pixels, it is possible to manufacture the light modulator 10 in the shape of a rectangle or a bar, wherein pixels may be arranged as needed and, thus, the panels may be exposed sequentially by scanning and light modulating performed by the light modulator 10.

Figure 11:
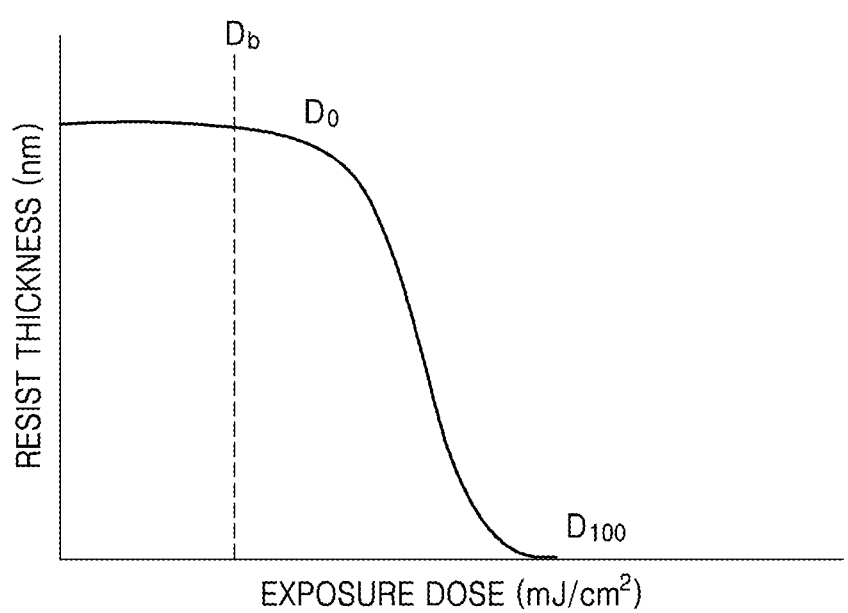
FIG. 11 is a graph showing a contrast curve of a positive photoresist.

FIG. 11 shows a contrast curve of a positive photoresist. A dose corresponding to $D_{100}$ should be irradiated on the photoresist for exposure. The photoresist is not exposed if a dose equal to or less than $D_0$ is applied.

The light modulator 10 according to some example embodiments controls a voltage applied to each pixel of elements so that the light modulator 10 may divide an exposed region wherein light equal to or greater than $D_{100}$ is incident, from an unexposed region wherein light equal to or less than $D_0$ is incident, and may form a intended pattern on the photoresist.

Basically, after power of a light source is controlled and exposure energy near $D_{100}$ is generated accordingly, the light modulator 10 is controlled and operated so as to divide $D_0$ from $D_{100}$.

In some example embodiments, when light from the light modulator 10 is not strong enough, in order to save time for exposure, the photoresist may be exposed altogether (e.g., blanket exposure) until a $D_b$ level is reached by another exposure apparatus prior to the light modulator 10, and may be further exposed (e.g., modulation exposure) until $D_{100}$ is reached by the light modulator 10 so as to form a pattern.

The light modulator 10 according to some example embodiments may control the amount of modulated light by using a voltage. Since the amount of light may be controlled by an arbitrary value between $D_0$ and $D_{100}$ as illustrated in FIG. 11, the thickness of the exposed photoresist may be manufactured to have an arbitrary thickness according to the amount of light. Furthermore, when there is a slight difference in the light modulation efficiency of each pixel, the applied voltage of each pixel may be controlled so that every pixel may show an uniform light modulation efficiency.

While one or more example embodiments of the present invention have been described with reference to the figures, it will be understood by those of ordinary skill in the art that various changes in form and details may be made therein without departing from the spirit and scope of the present invention as defined by the following claims.

As described above, according to some example embodiments, the light modulator may modulate UV light by using an electroabsorption method using a Group-III nitride semiconductor. Therefore it is possible to realize high speed drive and high resolution when the electroabsorption method is applied to the digital exposure apparatus. According to some example embodiments, the light modulator wherein the PIN diode including a multiple quantum well-formed of a Group-III nitride semiconductor material and the transistor are arrayed in an active matrix form, may modulate the UV light by the electroabsorption method, is capable of operating at high speed for mass production, and of reducing pixel sizes of an array to improve resolution.

Also, according to some example embodiments, when the light modulator is applied to the digital exposure apparatus, the light modulator is expected to be superior in terms of driving speed and resolution compared to a digital micromirror device (DMD) type light modulator for manufacturing display panels of the related art. Thus an expensive mask may be replaced by the light modulator and the time required for manufacturing masks may be omitted. As a result, the light modulator may be very cost-effective It should be understood that the example embodiments described herein should be considered in a descriptive sense only and not for purposes of limitation. Descriptions of features or aspects within each embodiment should typically be considered as available for other similar features or aspects in other embodiments.

What is claimed is:

1. A light modulator, comprising:
a light modulating unit formed as a pixel-array type by using a PIN diode including multiple quantum wells comprising a Group-III nitride semiconductor material, and configured to modulate light by electroabsorption; and
a control unit including a transistor configured to control voltage applied to the PIN diode of the light modulating unit;
wherein the PIN diode and the transistor are arrayed in an active matrix form;
wherein each pixel of the pixel-array type includes a separate Group-III nitride semiconductor material layer; and
wherein the light modulating unit and the transistor are overlapping when viewed in a direction normal to a primary surface of a substrate, the substrate having the light modulating unit and the transistor on the primary surface thereof.

2. The light modulator of claim 1, wherein the light modulating unit comprises:
a mirror layer on at least one of an upper part of the PIN diode and a lower part of the PIN diode.

3. The light modulator of claim 2, wherein the mirror layer is a distributed Bragg reflector (DBR).

4. The light modulator of claim 1, wherein the light modulating unit comprises:
a first mirror layer and a second mirror layer as a stack structure on an upper part of the PIN diode and a lower part of the PIN diode, respectively;
wherein at least one of the first mirror layer and the second mirror layer is a distributed Bragg reflector (DBR).

5. The light modulator of claim 1, wherein the light modulating unit comprises:

a mirror layer on one of an upper part of the PIN diode and a lower part of the PIN diode; and a distributed Bragg reflector (DBR) on the other one of the upper and lower parts of the PIN diode.

6. The light modulator of claim 1, wherein the light modulating unit and the control unit form a stack structure.

7. The light modulator of claim 1, wherein the light modulating unit comprises a first distributed Bragg reflector (DBR), a first material layer doped with a first conductivity type, a multiple quantum well layer, a second material layer doped with a second conductivity type opposite to the first conductivity type, and a mirror layer, stacked on a first substrate sequentially, and wherein the first material layer, the multiple quantum well layer, and the second material layer comprise Group-III nitride semiconductor material and form the PIN diode.

8. The light modulator of claim 7, wherein the first and second material layers comprise GaN.

9. The light modulator of claim 7, wherein the multiple quantum well layer comprises a multiple quantum well structure of InGaN/GaN.

10. The light modulator of claim 7, wherein the first DBR comprises a repeating stack of AlGaN/GaN.

11. The light modulator of claim 7, wherein the mirror layer is a second DBR, and wherein an electrode layer is on the mirror layer.

12. The light modulator of claim 7, wherein the mirror layer is configured as an electrode layer.

13. The light modulator of claim 7, wherein a buffer layer is between the first substrate and the first DBR.

14. The light modulator of claim 13, wherein the buffer layer comprises undoped GaN.

15. The light modulator of claim 7, wherein the first substrate comprises material including sapphire.

16. The light modulator of claim 7, wherein the control unit comprises:

a second substrate; and a transistor array on the second substrate.

17. The light modulator of claim 16, wherein the second substrate comprises material including silicon.

18. A manufacturing method of the light modulator of claim 1, the manufacturing method comprising:

forming the light modulating unit in a form of a pixel array;

forming the control unit; and bonding the light modulating unit to the control unit, so that a the transistor, which controls a the voltage applied to the PIN diode of the light modulating unit, is at a position corresponding to the light modulating unit of each pixel of the pixel array.

19. The manufacturing method of the light modulator of claim 18, wherein the light modulating unit is bonded to the control unit by flip-chip bonding.

20. A digital exposure apparatus, comprising:

a light source unit configured to generate light; and the light modulator of claim 1, configured to modulate an incident light beam emitted from the light source unit to an exposure beam that has image information to be exposed.

21. The light modulator of claim 1, wherein the transistor is configured to apply an individual voltage to each pixel.

* * * * *